(12) United States Patent
Park et al.

(10) Patent No.: US 9,807,880 B2
(45) Date of Patent: Oct. 31, 2017

(54) CIRCUIT BOARD AND LIGHTING DEVICE HAVING THE CIRCUIT BOARD

(71) Applicant: LG INNOTEK CO., LTD., Seoul (KR)

(72) Inventors: Hyun Gyu Park, Seoul (KR); Min Jae Kim, Seoul (KR); Se Woong Na, Seoul (KR); In Hee Cho, Seoul (KR); Man Hue Choi, Seoul (KR); Seung Kwon Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 48 days.

(21) Appl. No.: 14/314,967

(22) Filed: Jun. 25, 2014

(65) Prior Publication Data

US 2015/0003108 A1    Jan. 1, 2015

(30) Foreign Application Priority Data

Jun. 28, 2013 (KR) .................. 10-2013-0075342

(51) Int. Cl.
*H05K 1/14* (2006.01)
*F21V 8/00* (2006.01)
(Continued)

(52) U.S. Cl.
CPC .......... *H05K 1/148* (2013.01); *G02B 6/0068* (2013.01); *G02B 6/0083* (2013.01);
(Continued)

(58) Field of Classification Search
CPC ...... G02B 6/0083; G02B 6/009; H05K 1/148; H05K 1/0278; H05K 2201/10106
(Continued)

(56) References Cited

U.S. PATENT DOCUMENTS

| | | | |
|---|---|---|---|
| 7,973,876 B2 * | 7/2011 | Fu ........................ | G02B 6/0083 349/150 |
| 2006/0125981 A1 * | 6/2006 | Okuda ............. | G02F 1/133308 349/110 |

(Continued)

FOREIGN PATENT DOCUMENTS

| | | |
|---|---|---|
| KR | 1020130030619 A | 3/2013 |
| KR | 1020130037267 A | 4/2013 |
| WO | WO-2013094950 A1 | 6/2013 |

OTHER PUBLICATIONS

Extended European Search Report dated Feb. 16, 2015 in European Application No. 14174746.9.

*Primary Examiner* — Joseph L Williams
*Assistant Examiner* — Christopher Raabe
(74) *Attorney, Agent, or Firm* — Saliwanchik, Lloyd & Eisenschenk

(57) ABSTRACT

Provided is a circuit board including: a supporting substrate including a first region to which light emitting elements are mounted and a second region extending to be bent from the first region, wherein the second region comprises: a connector mounting portion to which a connector for supplying an electric current to the light emitting elements is mounted; and a non-mounting portion of a connector separated and spaced apart from the connector mounting portion, wherein the connector mounting portion is formed lower than the non-mounting portion of the connector.

14 Claims, 4 Drawing Sheets

(51) Int. Cl.
*H05K 1/02* (2006.01)
*H05K 3/36* (2006.01)

(52) U.S. Cl.
CPC ........... *H05K 1/0278* (2013.01); *H05K 3/366* (2013.01); *H05K 2201/10106* (2013.01); *H05K 2201/10189* (2013.01); *H05K 2203/302* (2013.01)

(58) Field of Classification Search
USPC .......................................................... 362/611
See application file for complete search history.

(56) References Cited

U.S. PATENT DOCUMENTS

| | | | | |
|---|---|---|---|---|
| 2006/0152944 A1* | 7/2006 | Nakayoshi | ........... | G02B 6/0021 362/631 |
| 2007/0126654 A1* | 6/2007 | Choi | ................. | G02F 1/133308 345/1.1 |
| 2008/0123335 A1* | 5/2008 | Yoo | ..................... | G02F 1/13452 362/257 |
| 2008/0192505 A1* | 8/2008 | Park | ....................... | G02B 6/009 362/615 |
| 2010/0007817 A1* | 1/2010 | Kim | ..................... | G02B 6/0083 349/60 |
| 2010/0053995 A1* | 3/2010 | Ohfuku | ................ | G02B 6/0091 362/613 |
| 2010/0128194 A1* | 5/2010 | Cho | .................. | G02F 1/133615 349/58 |
| 2011/0025944 A1* | 2/2011 | Lee | ...................... | G02B 6/0036 349/61 |
| 2011/0102726 A1* | 5/2011 | Nobeoka | ........... | G02F 1/133308 349/150 |
| 2011/0134364 A1* | 6/2011 | Neyama | ............ | G02F 1/133308 349/62 |
| 2012/0026424 A1* | 2/2012 | Youk | .................... | G02B 6/0083 349/62 |
| 2013/0141667 A1* | 6/2013 | Son | ...................... | G02B 6/0083 349/62 |

* cited by examiner (110)

(120)

CIRCUIT BOARD AND LIGHTING DEVICE HAVING THE CIRCUIT BOARD

CROSS-REFERENCE TO RELATED APPLICATION

This application claims the benefit under 35 U.S.C. §119 of Korean Patent Application No. 10-2013-0075342, filed Jun. 28, 2013, which is hereby incorporated by reference in its entirety.

BACKGROUND

Field of the Invention

Embodiments of the present invention relate to a circuit board and a lighting device having the circuit board.

Description of the Related Arts

A liquid crystal display (LCD) has no self-luminous which can make its own light, a separate lighting device is always needed for all the liquid crystal display devices. Such a lighting device serves as a light source of the liquid crystal display device, and a backlight unit (BLU) refers to a complex composed of a light source itself for irradiating light to a rear surface of a liquid module, a power circuit for driving the light source, and all components for enabling uniform flat light to be formed.

The liquid crystal display device becomes gradually thin, and accordingly, a reduction in a bezel width of the liquid crystal display device has been needed. As one example, in order to reduce the bezel width, the structure of a circuit board on which light emitting devices are mounted, or the structure of a lighting device including a light guide plate for guiding light generated from the light emitting devices has been changed.

However, even though the structure of the circuit board becomes thin, a shape of the connector for supplying an electric current to the light emitting elements has not been changed, and thus it is problematic in that it is difficult to reduce the bezel width due to the connector.

Accordingly, ways to mount the connector to the circuit board have been practically needed.

BRIEF SUMMARY

An aspect of embodiments of the present invention may provide a circuit board which is configured such that a supporting substrate to which a connector is mounted is formed lower than a supporting substrate to which a connector is not mounted, thereby reducing a space occupied by the connector.

Another aspect of embodiments of the present invention may provide a circuit board which is configured such that a supporting substrate to which a connector is mounted is formed lower than a supporting substrate to which a connector is not mounted so that light emitting elements can be prevented from being covered due to the connector, thereby enabling light efficiency to be improved.

A further aspect of embodiments of the present invention may provide a circuit board which is configured such that a supporting substrate to which a connector is mounted and a supporting substrate to which a connector is not mounted are separated and spaced apart from each other, and a connecting portion is formed between the two supporting substrates so that a step difference between the two supporting substrates can be adjusted by the connecting portion.

Yet another aspect of embodiments of the present invention may provide a circuit board which is configured such that a connecting portion for connecting a supporting substrate to which a connector is mounted and a supporting substrate to which a connector is not mounted is made of a flexible material so that a step difference between the two supporting substrates can be adjusted thanks to flexibility of the connection portion.

Still another aspect of embodiments of the present invention may provide a circuit board which is configured such that a connecting portion is formed in a second region of a supporting substrate by which string wirings for transmitting electrical signals to light emitting elements pass, or the connecting portion is formed in the second region of the supporting substrate which does not overlap with bending holes so that the connecting portion can be formed in various shapes.

Still further aspect of embodiments of the present invention may provide a circuit board which is configured such that a part of a first region of a supporting substrate corresponding to a connecting portion passes through a supporting substrate, or the first region connected to a second region to which a connector is mounted extends to the extent of a height of the connector so that the supporting substrate can be formed in various shapes.

Still further aspect of embodiments of the present invention may provide a lighting device capable of reducing a bezel width of a display device, when a circuit board is applied to the display device, the circuit board being configured such that a supporting substrate to which a connector is mounted is formed lower than a supporting substrate to which a connector is not mounted so that a space occupied by the connector can be reduced.

According to an aspect of the embodiments of the present invention, a circuit board may include a supporting substrate including a first region to which a light emitting element is mounted, and a second region extending to be bent from the first region, wherein the second region may include: a connector mounting portion to which a connector for supplying an electric current to the light emitting elements is mounted; and a non-mounting portion of a connector separated and spaced apart from the connector mounting portion, wherein the connector mounting portion may be formed lower than the non-mounting portion of the connector.

The circuit board may further include a connecting portion disposed in a portion in which a part of the second region of the supporting substrate is removed, and configured to connect the connector mounting portion and the non-mounting portion of the connector.

According to another aspect of the embodiments of the present invention, a circuit board may include: a supporting substrate including a first region and a second region extending to be bent from the first region; an insulating substrate on the supporting substrate; light emitting elements mounted to the first region; a connector mounting portion to which a connector for supplying an electric current to the light emitting elements is mounted, and which is placed in one part of the second region; a non-mounting portion of a connector separated and spaced apart from the connector mounting portion and placed in another part of the second region; and a connecting portion disposed in which the supporting substrate of the second region is removed, and which connects the connector mounting portion and the non-mounting portion of the connector using the insulating substrate.

The connector mounting portion may be disposed lower than the non-mounting portion of the connector to the extent of a height of the connector.

The connector mounting portion may be disposed lower than the non-mounting portion of the connector to the extent of a height of the light emitting elements.

The connecting portion may be made of at least one of PET (polyethylene terephthalate), PC (polycarbonate), PES (polyether sulfone), PI (polyimide) and PMMA (PolyMethly MethaAcrylate).

The connecting portion may include string wirings for transmitting electrical signals to the light emitting elements.

The circuit board may further comprising bending holes formed in a bending portion between the first region and the second region, wherein the connecting portion may be disposed in the second region except for the bending holes A part of the first region corresponding to the connecting portion may pass through the supporting substrate.

The supporting substrate may be configured such that the first region connected to the connector mounting portion extends to the extent of the height of the connector.

According to a further aspect of the embodiments of the present invention, a lighting device may include a circuit board and a light guide plate disposed to be spaced apart from the circuit board.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION

Figure 1:
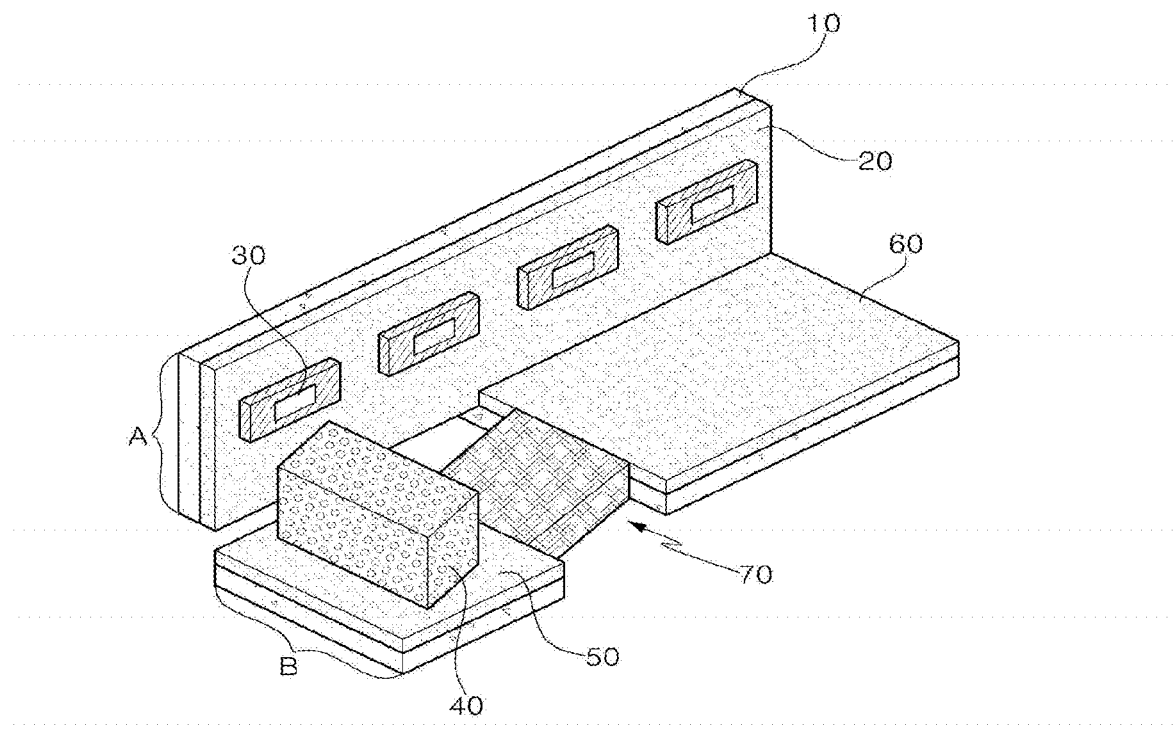
FIG. 1 is a view illustrating a circuit board according to one embodiment of the present invention.
Figure 1:
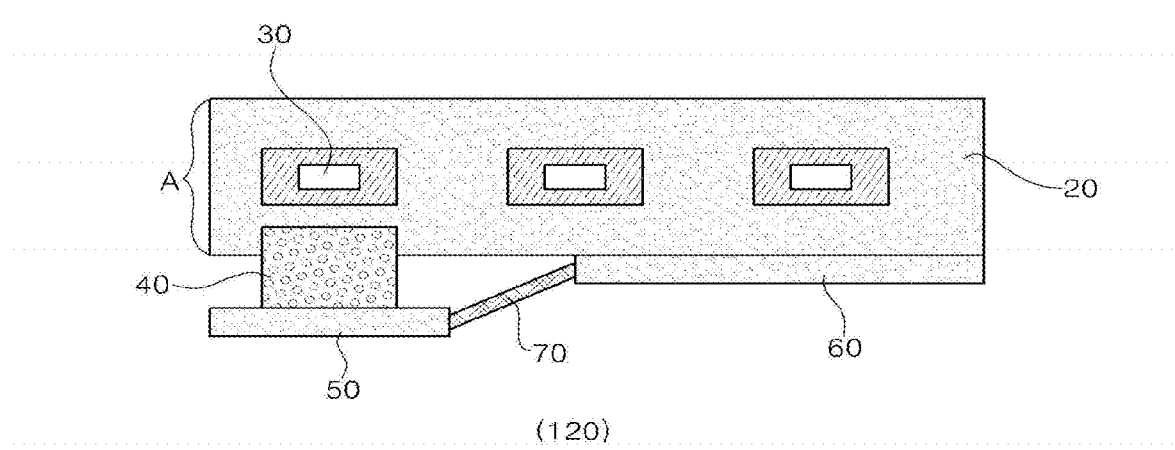

Hereinafter, the configurations and operations according to embodiments of the present invention will be described in detail with reference to the accompanying drawings. The present invention may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms is used only for the purpose for distinguishing a constitutive element from other constitutive element.

FIG. 1 is a view illustrating a circuit board according to one embodiment of the present invention.

Referring to FIG. 1, a circuit board 110 includes: a supporting substrate 10 including a first region A to which light emitting elements 30 are mounted, and a second region B extending to be bent from the first region A; a connector mounting portion 50 of the second region B to which a connector for supplying an electric current to the light emitting elements 30 is mounted; and a non-mounting portion of a connector 60 separated and spaced apart from the connector mounting portion 50 in the second region B. In particular, the connector mounting portion 50 may be formed lower than the non-mounting portion of the connector 60. Here, the circuit board 110 may further include: an insulating substrate 20 on the supporting substrate 10; and a connecting portion 70 disposed in a part passing through the second region B of the supporting substrate 10 and configured to connect the connector mounting portion 50 and the non-mounting portion of the connector 60.

A circuit board of reference numeral 120 shows a view of the circuit board as viewed from a front surface when the connector 40 is mounted. The connecting portion 70 connects the connector mounting portion 50 and the non-mounting portion of the connector 60 which are separated from each other, and the circuit board 120 may show a state in which the supporting substrate 10 is removed, and only the insulating substrate 20 remains.

In one embodiment, the connecting portion 70 may be made of a flexible material having flexibility. For example, the connecting portion 70 may be made of at least one of PET (polyethylene terephthalate), PC (polycarbonate), PES (polyether sulfone), PI (polyimide) and PMMA (PolyMethly MethaAcrylate). That is, the connecting portion 70 may be the insulating substrate 20, or may be made of the same material as that of the insulating substrate 20 or a flexible material different from that of the insulating substrate 20.

Figure 2:
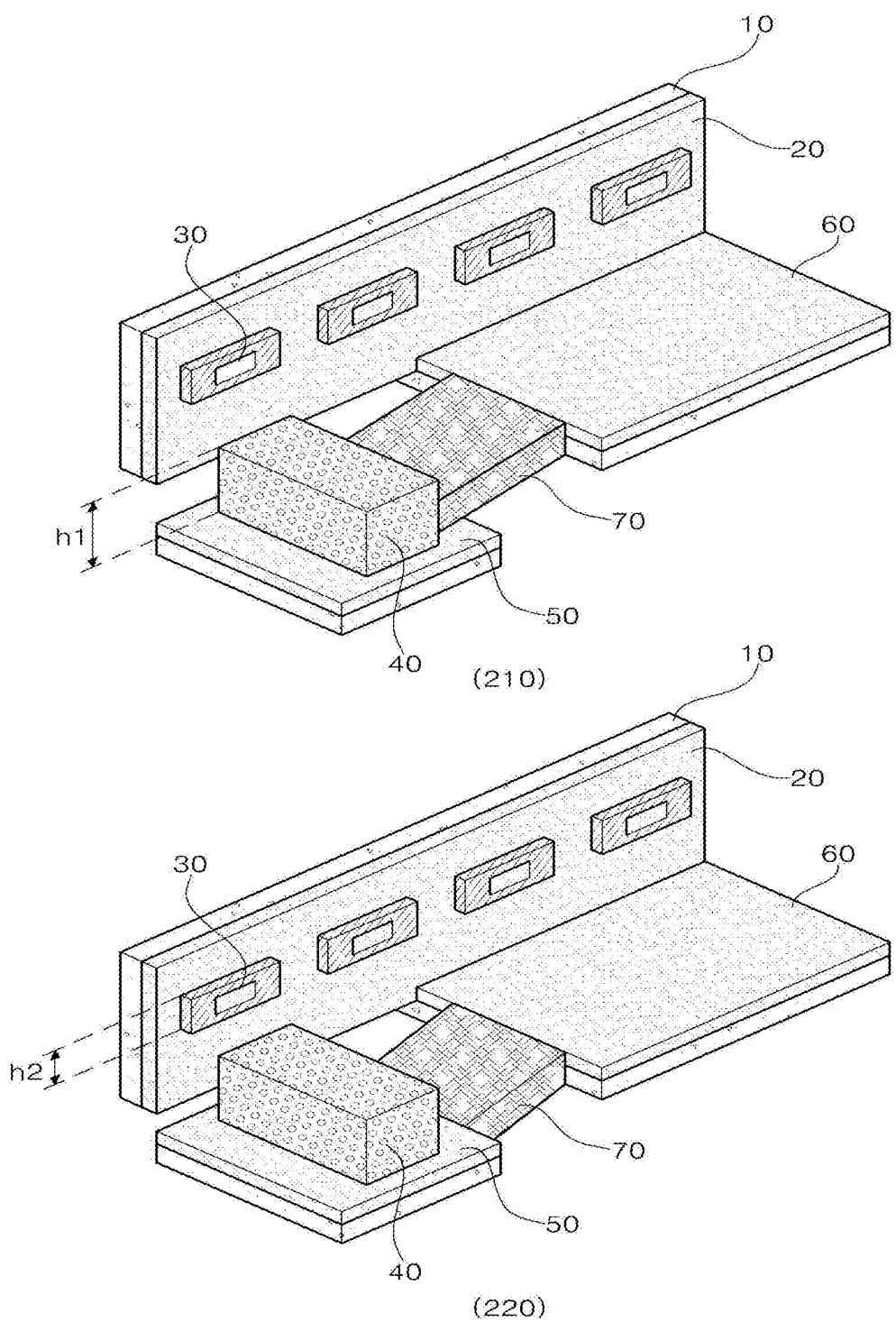
FIG. 2 is a view illustrating an arrangement relation between a connector mounting portion and a non-mounting portion of a connector.

FIG. 2 is a view illustrating an arrangement relation between the connector mounting portion and the non-mounting portion of the connector.

Referring to FIG. 2, the connector mounting portion 50 may be disposed lower than the non-mounting portion of the connector 60 to the extent of a height h1 of the connector 40 (210). The fact that the connector mounting portion 50 is disposed lower than the non-mounting portion of the connector 60 is intended not to cover the light emitting elements 30, and in consideration of the fact that the connector 40 is mounted to the connector mounting portion 50, the connector mounting portion 50 may be disposed lower than the non-mounting portion of the connector 60 to the extent of the height h1 of the connector 40.

Also, the connector mounting portion 50 may be disposed lower than the non-mounting portion of the connector 60 to the extent of a height h2 of the light emitting elements 30 (220). In order for the light emitting elements 30 not to be covered by the connector 40 mounted to the connector mounting portion 50, the connector mounting portion 50 may be disposed lower than the non-mounting portion of the connector 60 to the extent of the height h2 of the light emitting elements 30.

Figure 3:
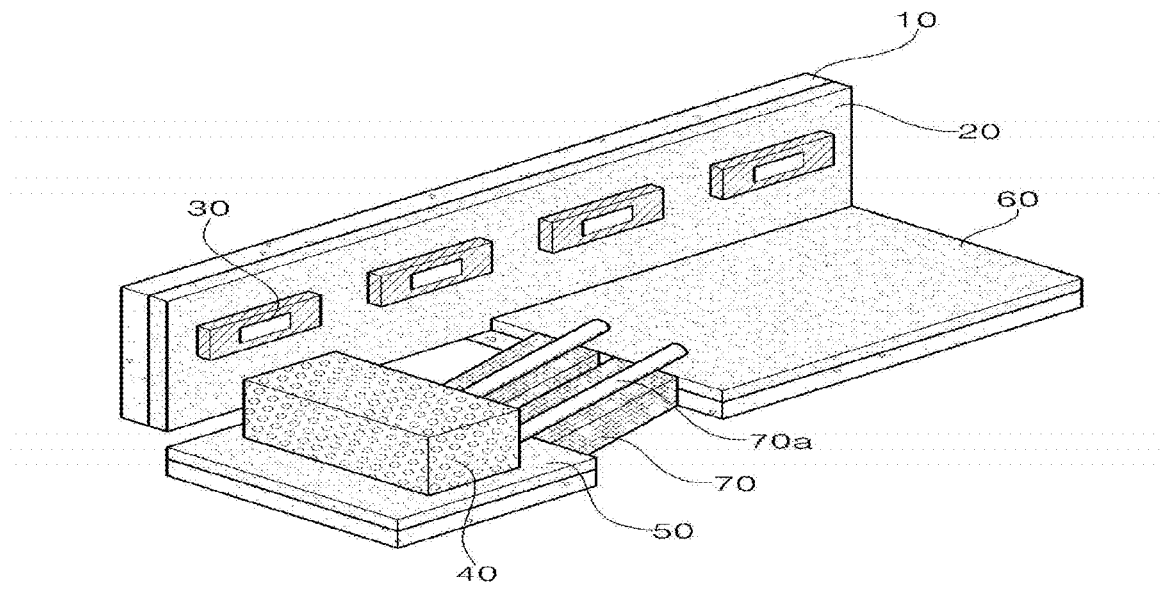
FIGS. 3 and 4 are views illustrating one example of a connecting portion according to one embodiment of the present invention.
Figure 4:
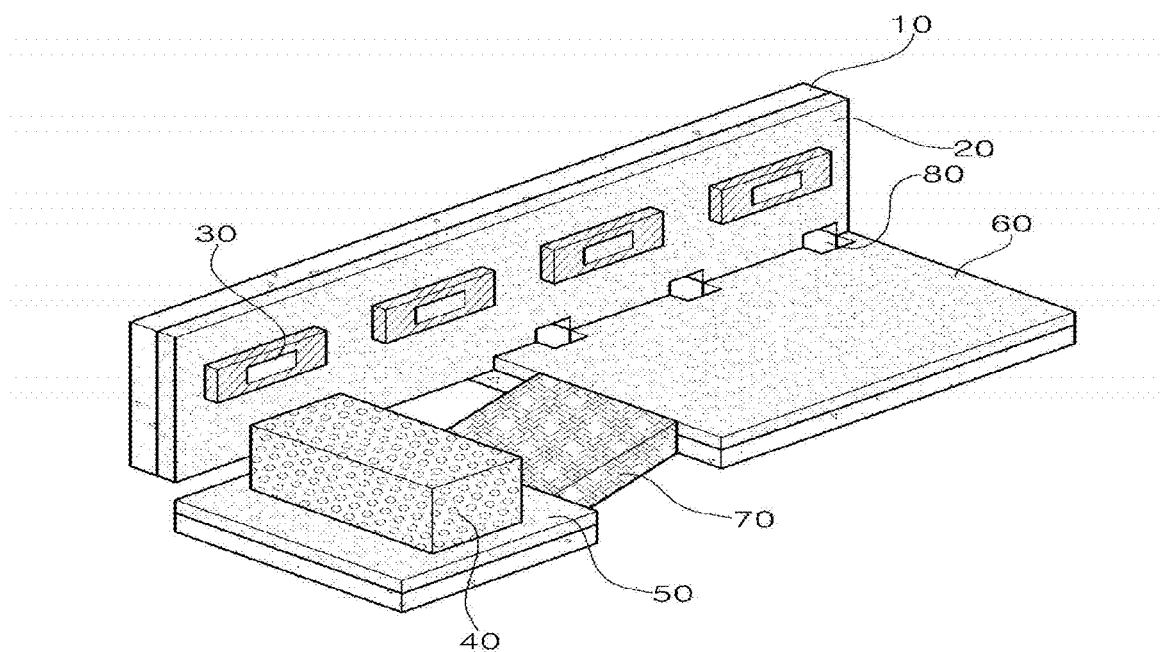

FIGS. 3 and 4 are views illustrating one example of the connecting portion according to one embodiment of the present invention.

Referring to FIG. 3, the connecting portion 70 may include string wirings 70a for transmitting electrical signals to the light emitting elements 30. For example, the connecting portion 70 may be formed only in the second region B by which the string wirings 70a passes.

Referring to FIG. 4, the circuit board may include bending holes 80 formed in a bending portion between the first region A and the second region B. The bending holes 80 are formed to enable the circuit board to be easily bent. At this time, the connecting portion 70 may be disposed in the second region B except for the bending holes 80. That is, the connecting portion 70 may be disposed in the second region B which does not overlap with the bending holes 80.

Figure 5:
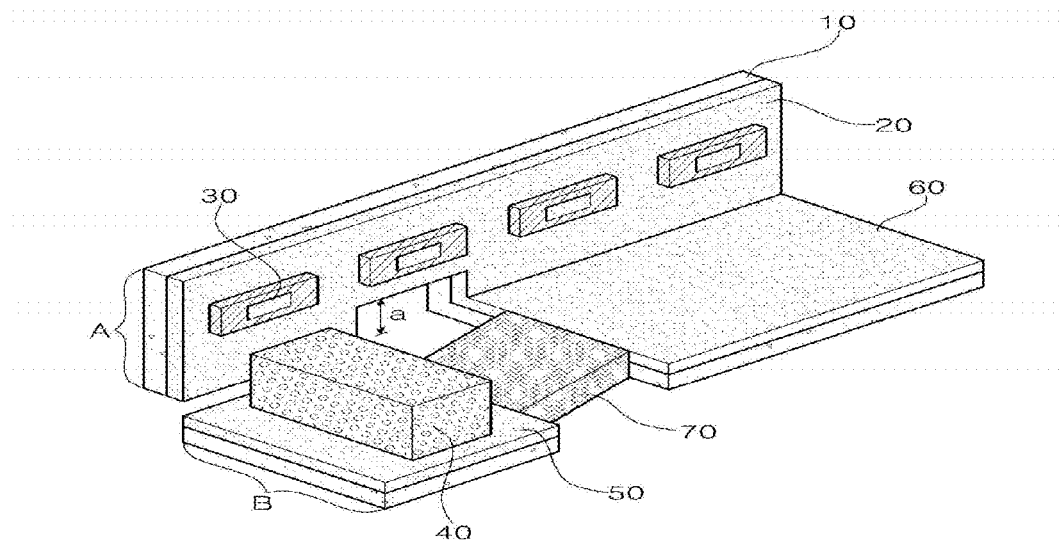
FIGS. 5 and 6 are views illustrating one example of a supporting substrate according to one embodiment of the present invention.
Figure 6:
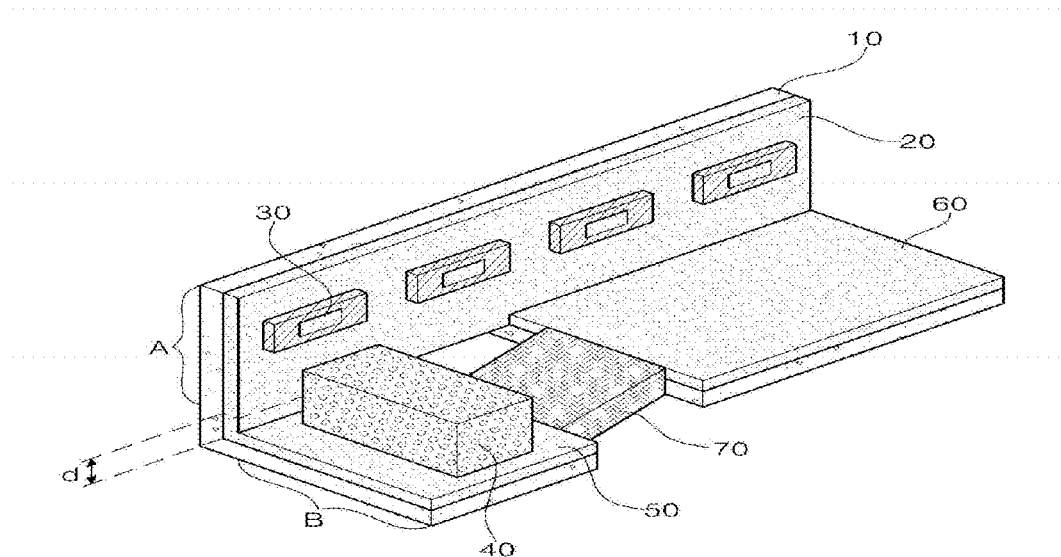

FIGS. 5 and 6 are views illustrating one example of the supporting substrate according to one embodiment of the present invention.

Referring to FIG. 5, in the supporting substrate 10, a part (a) of the first region A corresponding to the connecting portion 70 may be removed. For example, the supporting substrate 10 may be made of at least one of Al, Au, Ag, Cr, an organic compound, an inorganic compound, a magnetic material and a conductive material. That is, since the supporting substrate 10 may be made of a stronger material than that of the insulating substrate 20, the part (a) of the supporting substrate 10 of the first region A corresponding to a position in which the connecting portion 70 is formed may be removed so that the connecting portion 70 can enable a step difference between the connector mounting portion 50 and the non-mounting portion of the connector 60 to be easily overcome.

Referring to FIG. 6, in the supporting substrate 10, a part d of the first region A connected to the connector mounting portion 50 may extend. For example, the supporting substrate 10 may enable the first region A connected to the connector mounting portion 50 to extend to the extent of a height h1 of the connector 40. Accordingly, as the supporting substrate 10 of the first region A in which the connector mounting portion is formed extends to the extent of the height h1 of the connector 40, the connector mounting portion 50 and the non-mounting portion of the connector 60 may be more stably connected to each other.

The circuit board according to one embodiment of the present invention may have pad wirings (not drawn) connected to the light emitting elements 30 mounted on the insulating substrate 20.

The circuit board according to another embodiment of the present invention may be configured such that the insulating substrate 20 is formed on one surface of the first region A of the supporting substrate 10 and another surface opposite to the one surface, pad wirings connected to the light emitting elements 30 mounted on one surface of the insulating substrate 20 are formed, and string wirings for transmitting electrical signals to the light emitting elements are formed on another surface of the insulating substrate 20. Also, the string wirings may be formed at a side in which the one surface and the other surface of the insulating substrate 20 meet, and thus the string wirings and the pad wirings may be connected.

The circuit board according to still another embodiment of the present invention may be configured such that the string wirings are formed in the bending holes 80 so that the string wirings and the pad wirings can be connected.

The circuit board according to still another embodiment of the present invention may be configured such that the string wirings for transmitting electrical signals to the light emitting elements 30 are formed on another surface of the second region B of the insulating substrate 20.

The circuit board according to still another embodiment of the present invention may be configured such that edge patterns are formed on at least one side of the supporting substrate 10.

The lighting device according to one embodiment of the preset invention may reduce a bezel width of a display device, when a circuit board is applied to the display device, by providing the circuit board configured such that a supporting substrate to which a connector is mounted is formed lower than a supporting substrate to which a connector is not mounted so that a space occupied by the connector can be reduced.

As set forth above, according to one embodiment of the present invention, the supporting substrate to which the connector is mounted is formed lower than the supporting substrate to which a connector is not mounted so that a space occupied by the connector can be reduced.

According to one embodiment of the present invention, the supporting substrate to which the connector is mounted is formed lower than the supporting substrate to which the connector is not mounted so that the light emitting elements can be prevented from being covered due to the connector, thereby enabling light efficiency to be improved.

According to one embodiment of the present invention, the supporting substrate to which the connector is mounted and the supporting substrate to which the connector is not mounted are separated and spaced apart from each other, and the connecting portion is formed between the two supporting substrates so that a step difference between the two supporting substrates can be adjusted by the connecting portion.

According to one embodiment of the present invention, the connecting portion for connecting the supporting substrate to which the connector is mounted and the supporting substrate to which the connector is not mounted is made of a flexible material so that a step difference between the two supporting substrates can be adjusted thanks to flexibility of the connection portion.

According to one embodiment of the present invention, the connecting portion is formed in the second region of the supporting substrate by which the string wirings for transmitting electrical signals to light emitting elements pass, or the connecting portion is formed in the second region of the supporting substrate which does not overlap with the bending holes so that the connecting portion can be formed in various shapes.

According to one embodiment of the present invention, a part of the first region of the supporting substrate corresponding to a connecting portion passes through the supporting substrate, or the first region connected to the second region to which the connector is mounted extends to the extent of the height of the connector so that the supporting substrate can be formed in various shapes.

According to one embodiment of the present invention, it can be provided with the lighting device capable of reducing the bezel width of the display device, when a circuit board is applied to the display device, the circuit board being configured such that the supporting substrate to which the connector is mounted is formed lower than the supporting substrate to which the connector is not mounted so that the space occupied by the connector can be reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

What is claimed is:

1. A circuit board, comprising:
   a supporting substrate including a first region to which light emitting elements are mounted and a second region extending to be bent from the first region;
   a connecting portion; and
   bending holes formed in a bending portion between the first region and the second region;

wherein the connecting portion is disposed in the second region, wherein the second region comprises a connector mounting portion to which a connector for supplying an electric current to the light emitting elements is mounted and a non-mounting portion to which no connector is mounted and being spaced apart from the connector mounting portion, wherein the connector mounting portion is disposed lower than the non-mounting portion such that the connector mounted on the connector mounting portion does not vertically overlap the light emitting elements, wherein the bending portion includes a first bending portion bent from the first region to the connector mounting portion and a second bending portion bent from the first region to the non-mounting portion, wherein the second bending portion is spaced apart from the first bending portion, wherein a height of the first region extending to the first bending portion is higher than a height of the first region extending to the second bending portion by a height difference between the connector mounting portion and the non-mounting portion, wherein a part of the first region between the first bending portion and the second bending portion is removed such that the light emitting elements are mounted in the first region, and wherein the connecting portion is configured to connect the connector mounting portion and the non-mounting portion.

2. The circuit board of claim 1, wherein the connector mounting portion is disposed lower than the non-mounting portion to an extent of a height of the connector.

3. The circuit board of claim 1, wherein the connector mounting portion is disposed lower than the non-mounting portion to an extent of a height of the light emitting elements.

4. The circuit board of claim 1, wherein the connecting portion is made of at least one of PET (polyethylene terephthalate), PC (polycarbonate), PES (polyether sulfone), PI (polyimide) and PMMA (PolyMethly MethaAcrylate).

5. The circuit board of claim 1, wherein the connecting portion comprises string wirings for transmitting electrical signals to the light emitting elements.

6. A lighting device, comprising:
a circuit board of claim 1; and
a light guide plate disposed to be spaced apart from the circuit board.

7. A circuit board, comprising:
a supporting substrate including a first region and a second region extending to be bent from the first region, the second region having a connector mounting portion to which a connector supplying an electric current to light emitting elements is mounted and a non-mounting portion to which no connector is mounted and being spaced apart from the connector mounting portion;
an insulating substrate on the supporting substrate;
light emitting elements mounted to the first region;
a connecting portion connecting the connector mounting portion and the non-mounting portion;
bending holes formed in a bending portion between the first region and the second region;

wherein the connecting portion is disposed in the second region, wherein the connector mounting portion is disposed lower than the non-mounting portion such that the connector mounted on the connector mounting portion does not vertically overlap the light emitting elements, wherein the bending portion includes a first bending portion bent from the first region to the connector mounting portion and a second bending portion bent from the first region of the non-mounting portion, wherein the second bending portion is spaced apart from the first bending portion, wherein a height of the first region extending to the first bending portion is higher than a height of the first region extending to the second bending portion by a height difference between the connector mounting portion and the non-mounting portion, and wherein a part of the first region between the first bending portion and the second bending portion is removed such that the light emitting elements are mounted in the first region.

8. The circuit board of claim 7, wherein the connector mounting portion is disposed lower than the non-mounting portion of the connector to an extent of a height of the connector.

9. The circuit board of claim 7, wherein the connector mounting portion is disposed lower than the non-mounting portion of the connector to an extent of a height of the light emitting elements.

10. The circuit board of claim 7, wherein the connecting portion is made of at least one of PET (polyethylene terephthalate), PC (polycarbonate), PES (polyether sulfone), PI (polyimide) and PMMA (PolyMethly MethaAcrylate).

11. The circuit board of claim 7, wherein the connecting portion comprises string wirings for transmitting electrical signals to the light emitting elements.

12. A lighting device, comprising:
a circuit board of claim 7; and
a light guide plate disposed to be spaced apart from the circuit board.

13. The circuit board of claim 5, wherein the string wirings are formed in the bending holes, being connected to pad wirings.

14. The circuit board of claim 5, wherein the string wirings are formed on a surface of the second region.

* * * * *